Figure 1:
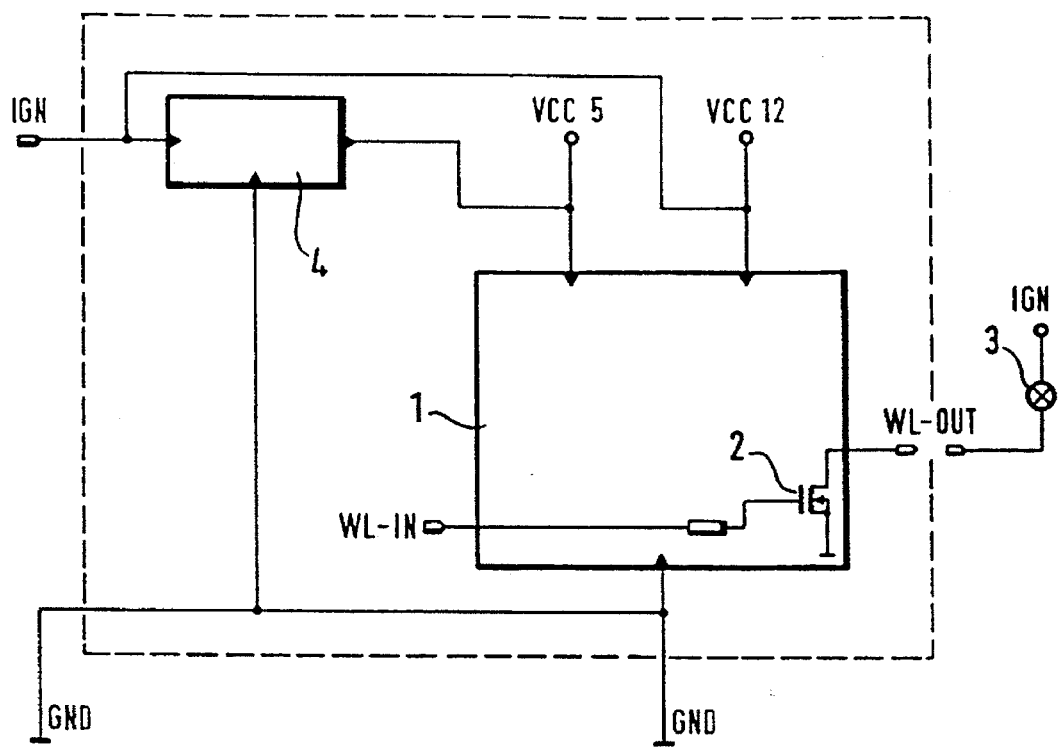

United States Patent
Zydek et al.

[11] Patent Number: 5,631,626
[45] Date of Patent: May 20, 1997

[54] CIRCUIT FOR TRIGGERING WARNING LAMPS

[75] Inventors: Michael Zydek, Langgons; Wolfgang Fey, Niedernhausen; Mario Engelmann, Steinbach, all of Germany

[73] Assignee: ITT Automotive Europe GmbH, Germany

[21] Appl. No.: 530,113

[22] PCT Filed: Mar. 12, 1994

[86] PCT No.: PCT/EP94/00771

§ 371 Date: Oct. 2, 1995

§ 102(e) Date: Oct. 2, 1995

[87] PCT Pub. No.: WO94/22700

PCT Pub. Date: Oct. 13, 1994

[30] Foreign Application Priority Data

Mar. 31, 1993 [DE] Germany .............. 43 10 530.0

[51] Int. Cl.$^6$ ........................ B60Q 1/44
[52] U.S. Cl. ............ 340/479; 340/438; 340/439; 340/458; 361/49; 361/88
[58] Field of Search .................. 340/438, 439, 340/453, 458; 361/49, 88

[56] References Cited

U.S. PATENT DOCUMENTS 4,016,457  4/1977  Frait .......................... 361/49
4,709,223  11/1987  Crapanzano .............. 340/453
5,129,259  7/1992  View et al. ............... 340/453

FOREIGN PATENT DOCUMENTS 2701159  1/1977  Germany .
2938344  9/1979  Germany .
3234630  9/1982  Germany .
4117099  5/1991  Germany .
4037175  6/1991  Germany .

OTHER PUBLICATIONS

English Translation of the Int'l Preliminary Examination Report for Appln No. PCT/EP94/00771.
Search Report of the German Patent Office for Application P4310530.0.
Application Note Publications Elektronik 11/27.5.1988.

*Primary Examiner*—Jeffery Hofsass
*Assistant Examiner*—Daryl C. Pope
*Attorney, Agent, or Firm*—Thomas N. Twomey; J. Gordon Lewis

[57]  ABSTRACT

A circuit for triggering warning lamps including a self-conductive transistor circuit with a triggering circuit connected to the supply voltages. The triggering circuit keeps the transistor circuit blocked if the supply voltages are proper. If voltage fails, the transistors of the self-conductive transistor circuit open a current path from the warning lamp terminal to the control terminal of the power driver which results in switching on of the power driver and, thus, of the warning lamp.

2 Claims, 1 Drawing Sheet

CIRCUIT FOR TRIGGERING WARNING LAMPS

The present invention relates to a circuit for triggering the warning lamp of an automotive vehicle brake system with electronic anti-lock and/or traction slip control, including a power driver through which the warning lamp current flows in the presence of a monitoring signal or error signal initiated by malfunction of the controller.

In brake systems with electronic anti-lock or traction slip control, disconnection of the control when malfunction occurs is common practice or is even provided by the law to ensure at least braking operations without control in the case of malfunction. The detection of a fault is optically signalled by way of a warning lamp. Known brake systems of this type include a mechanic relay, for example a so-called master relay, having a normally open contact by which the controller of the brake system can be switched on and off. This relay has also a normally closed contact by which the warning lamp is switched on when the relay is deenergized.

When instead of the mechanic relay a semiconductor relay is used (which is favorable for various reasons), the problem is that, if the current supply fails, there is no possibility of triggering the warning lamp which is comparable with the normally closed contact of the mechanic relay. However, flashing up of the warning lamp whenever the control is disconnected is an important safety aspect and often even a legal provision. Therefore, an object of the present invention is to ensure switching on of the warning lamp in a simple way and without considerably increasing the manufacturing expenditure, even if the controller is energized by a semiconductor relay.

It has been found that this object can be achieved by the improvement of a circuit for triggering warning lamps as described in the accompanying claim 1. Favorable embodiments of the circuit according to the present invention are described in the subclaims.

Thus, according to the present invention, the triggering circuit of the warning lamp is supplemented by an additional circuit which, when supply voltages are available, does not take effect on the triggering of the warning lamp and which becomes self-conductive and, therefore, closes the current path leading via the warning lamp to ground in the event of failure of any or all of the supply voltages.

The additional circuit substantially comprises a small number of low-power transistors which can be provided by modifying the integrated warning lamp driver circuit. The additional manufacturing expenditure required is minimized.

Further features, advantages and possible applications of the present invention can be seen in the following description of details of the present invention by way of the accompanying drawings.

Figure 2:
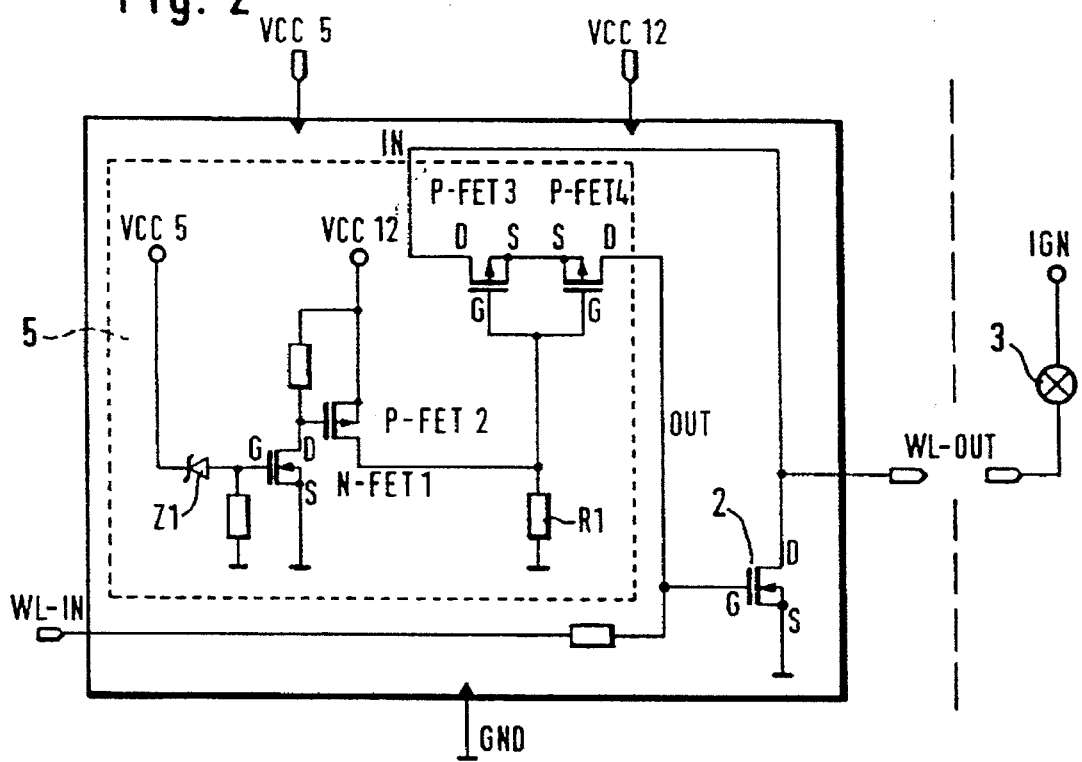

In a schematically simplified view in the drawings,

FIG. 1 is a circuit for triggering warning lamps, the various connections being shown symbolically, and FIG. 2 is an enlarged view of details of the actual warning lamp triggering circuit according to FIG. 1.

FIG. 1 shows a module 1 representing the circuit for triggering warning lamps according to the present invention. This circuit is an integrated circuit comprising, among others, a power transistor or power driver 2 by way of which the current for flashing up of the warning lamp 3 is conducted when a monitoring signal or a signal indicating a fault exists. For example, a power field effect transistor FET can be used as power driver 2. The monitoring signal or signal to trigger the transistor 2 is supplied to the circuit 1 via the warning lamp inlet WL-IN.

The warning lamp circuit 1 in the embodiment of FIG. 1 is supplied with two voltages of a different magnitude. In the present example, a voltage of 5 volt stabilized by a voltage controller is applied to inlet VCC5, while the vehicle battery voltage of 12 volt, for example, is applied directly to second supply inlet VCC12 in this case. The battery voltage is supplied by an ignition contact terminal IGN. The warning lamp 3 is connected by a terminal WL-OUT. Also, the warning lamp is energized by the ignition switch IGN to which the battery voltage is applied. Of course, the circuit 1 is also connected to ground GND.

Additional circuit 5, shown in FIG. 2 in detail, is an integrated component part of module 1 comprising the warning lamp triggering circuit. The dotted lines indicate the correlation of the illustrated electronic parts. In FIG. 2, too, only the power driver 2 of the warning lamp triggering circuit 1 is shown.

The additional circuit 5 comprises antiserially connected p-channel field effect transistors P-FET3 and P-FET4. Transistors of this type are self-locking. According to the present invention, however, they are supplemented by connecting gate electrodes G of the transistors P-FET3 and P-FET4 to ground GND, via a high-ohmic resistor R1, to provide a self-conductive transistor circuit.

When the two supply voltages VCC5 and VCC12 are connected properly, the two gate terminals of the transistors P-FET3 and P-FET4 are (almost) on the potential of the voltage terminal VCC12. The two transistors N-FET1 and P-FET2, connected in cascading fashion, by which the two antiserially connected transistors P-FET3 and P-FET4 are triggered, are switched "on" when both the supply voltage VCC5 and the supply voltage VCC12 are applied so that the potential on terminal VCC12 is practically identical with the potential on the gate electrodes G of the antiserial transistors P-FET3 and P-FET4.

If either voltage VCC5 or VCC12 fails, the current flow through the respective transistor N-FET1 or P-FET2 is blocked so that, now, R1 determines the potential on the gate electrodes of the antiserial transistors P-FET3 and P-FET4. The transistors P-FET3, P-FET4 are "switched on" thereby. The gate threshold voltage for switching on the power transistor 2 is exceeded.

Voltage will now be applied to the gate electrode of the power driver 2 by way of the antiserial transistors P-FET3 and P-FET4 because there is a connection to the vehicle battery through the terminal WL-OUT, the warning lamp 3 and IGN. The power transistor 2 which is thereby saturated will finally cause the warning lamp 3 to flash up.

The provision of a zener diode Z1 in the path of the transistor N-FET1 connecting to the voltage source VCC5 results in fault signalling already when the voltage VCC5 falls below a threshold value which depends on the zener voltage and the gate threshold voltage of the transistor N-FET1.

The circuit according to the present invention affords the advantage, which is very important in practical operations, that the warning lamp 3 is switched on directly by the saturated power transistor 2 even on failure of the supply voltages VCC5 and/or VCC12. Additional voltage drop in the (deenergized) additional circuit or triggering circuit of the transistor 2 will not occur. The brightness of the warning lamp 3, which is critical at relatively low battery voltages, is not impaired.

We claim:

1. A circuit for triggering the warning lamp of an automotive vehicle brake system having electronic anti-lock or traction slip control, of the type including an electronic controller connected to one or a plurality of supply voltages, a power driver through which the warning lamp current flows in the presence of a monitoring signal initiated by malfunction of the controller, comprising:

a self-conductive transistor circuit with a triggering circuit connected to the supply voltages of the controller which, as long as all supply voltages are present, keeps the transistor circuit blocked and, on failure or decline of any of the supply voltages below a threshold value, causes current to flow to the warning lamp to the control terminal of the power driver to trigger or switch on the power driver, wherein the self-conductive transistor circuit includes two serially connected p-channel field effect transistors, the gate terminals of which are interconnected, connected to the outlet of the triggering circuit, and connected to ground by way of a high-ohmic resistor.

2. A circuit as claimed in claim 1, wherein the power driver is a field effect transistor having its drain electrode extend to the warning lamp, and in that the path formed of the two drain source paths of the serially connected transistors of the self-conductive transistor circuit is connected in parallel to the drain gate path of the power driver.

* * * * *